(12) United States Patent
Soref et al.

(10) Patent No.: US 6,621,841 B1
(45) Date of Patent: Sep. 16, 2003

(54) PHONON-PUMPED SEMICONDUCTOR LASERS

(75) Inventors: Richard A. Soref, Newton Centre, MA (US); Gregory Sun, Wilmington, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 10/132,328

(22) Filed: Apr. 23, 2002

(51) Int. Cl.$^7$ ................................................. H01S 5/00
(52) U.S. Cl. ............................. 372/43; 372/44; 372/34; 372/36; 257/13; 257/19; 257/30; 257/97
(58) Field of Search .............................. 372/43, 44, 36, 372/34; 257/30, 19, 13, 97

(56) References Cited

U.S. PATENT DOCUMENTS

| | | | | |
|---|---|---|---|---|
| 5,570,386 A | * | 10/1996 | Capasso et al. | ................ 372/46 |
| 6,055,815 A | * | 5/2000 | Peterson | ........................ 62/3.7 |
| 6,154,475 A | * | 11/2000 | Soref et al. | .................... 372/45 |
| 6,169,245 B1 | * | 1/2001 | Sharp | ......................... 136/205 |
| 6,403,975 B1 | * | 6/2002 | Brunner et al. | ................ 257/15 |
| 6,483,100 B1 | * | 11/2002 | Williams et al. | ......... 250/214.1 |

* cited by examiner

*Primary Examiner*—Paul Ip
*Assistant Examiner*—Delma R. Flores Ruiz
(74) *Attorney, Agent, or Firm*—William G. Auton

(57) ABSTRACT

The first phonon-pumped semiconductor laser. The active region is an unbiased boron-doped $Si_{0.94}Ge_{0.06}$/Si superlattice with $Si_{0.97}Ge_{0.03}$ buffer layers embedded in a surface-plasmon strip waveguide. Warm and cool heat sinks create a temperature gradient across the waveguide. A heat buffer layer adjacent to the cool sink reflects optical phonons and transmits acoustic phonons. Within the resonator, the difference in effective temperatures of optical and acoustic phonons provides hole pumping for the lasing transition between the heavy-hole 2 (HH2) and heavy-hole 1(HH1) minibands. A gain of 280/cm at the 5THz emission frequency is predicted for $6 \times 10^{17}/cm^3$ doping at temperatures of 300K and 77K for optical and acoustic phonons, respectively.

1 Claim, 6 Drawing Sheets

PHONON-PUMPED SEMICONDUCTOR LASERS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to lasers and more specifically to a design for a phonon-pumped laser system. Ever since the invention of the laser, electrical pumping and optical pumping have been the primary laser pumping methods. To the best of our knowledge, no one has proposed to pump a laser solely with phonons—an alternative that is potentially important and practical. This invention presents the first conception and analysis of a phonon-pumped semiconductor laser designed for far-infrared THz emission.

Photon pumped lasers are known and described in the following U.S. Patents, the disclosures of which are incorporated herein by reference:

U.S. Pat. No. 4,592,056, May 27, 1986, Resonant photon pumping mechanisms for a plasma x-ray laser, Elton, Raymond C., and U.S. Pat. No. 4,398,294, Aug. 9, 1983, High power nuclear photon pumped laser, Miller Thomas G.

However the "phonon" is defined as the quantum of crystal lattice vibrational energy. Phonons are analogous to the quanta of light, i.e. photons.

Phonon based lasers are shown in U.S. Pat. No. 5,699,372, Dec. 16, 1997, Wavelength-conversion solid-state laser, Okazaki, which uses a semiconductor laser as a pump source; and U.S. Pat. No. 3,624,553, Nov. 30, 1971, Cyclotron resonator laser in a P-type semiconductor, Van-Tran, Nguyen.

SUMMARY OF THE INVENTION

The invention is a miniature, cw, semiconductor superlattice laser whose wavelength of emission is in the 30 to 120 um range. No optical pumping or electrical pumping is used. There are no electrical contacts on the superlattice which is in the flat-band condition. The coherently strained superlattice is epitaxially grown from IV-IV or III-V or II-VI materials. The dispersion curves of the superlattice as a function of superlattice wavevector kZ are engineered by choice of quantum well-and-barrier composition and thickness to create a four-level laser system for the two minibands of interest: either conduction minibands, or valence minibands. The quantum wells are doped n-type (for CB lasers) or p-type (for VB lasers), and LO optical phonons are used to pump carriers from the populated ground state miniband valley to the laser's upper miniband. The LO phonons have a higher effective temperature than acoustic phonons present in the superlattice because a semiconductor "heat buffer layer" atop the superlattice (transparent to acoustic phonons) is used to reflect LO phonons back into the laser and confine them there. The vertical radiative THz emmision is between minibands. The hot LO phonons are created by a temperature gradient across the superlattice. A cold sink (T~77K) contacts the lower surface of the superlattice and a hot sink (T~300K) contacts the top surface. A cold finger may be the lower sink, and a thin-film electrical-resistance-heater may be the upper heat sink. The laser may also be constructed by engineering an opposite curvature for dispersion curves as a function of inplane wavevector kX or kY, an engineering of inverted effective mass.

DESCRIPTION OF THE PREFERRED EMBODIMENT

The present invention is a phonon-pumped semiconductor laser in which the active region is a simple square-well superlattice (SL); there are no electrical contacts on the proposed structure and the SL is in a flat-band condition. The structure is simple, scaleable in its power output, easy to fabricate, cw in operation, and tunable to some extent. We have focused upon IV-IV heterostructures, but the principle applies to III-V and II-VI lasers as well. The proposed laser makes use of a temperature gradient that is produced laterally across a waveguided SL structure, and the gradient is supplied by a pair of heat sinks, warm and cold, that contact the waveguide above and below, respectively, along the SL growth-axis direction z. In intersubband lasers such as the quantum cascade, fast phonon-assisted recombination (along with Auger recombination) often makes is difficult to achieve population inversion. On the other hand, phonon scattering frequently plays a crucial role in depopulating the lower laser level. Thus, "phonon engineering" can be beneficial in some situations. We find that the useful effects of phonon absorption come into play when the laser photon energy $\hbar\omega_L$ is less than the optical phonon energy $\hbar\omega_o$, where $\hbar\omega_o$=64.5 meV for Si and 37.2 meV for Ge. Starting with a SL that has a populated (doped) ground state, we have investigated the phonon-induced excitation of carriers in structures that have different effective temperatures for the optical and acoustic phonon modes.

Figure 1:
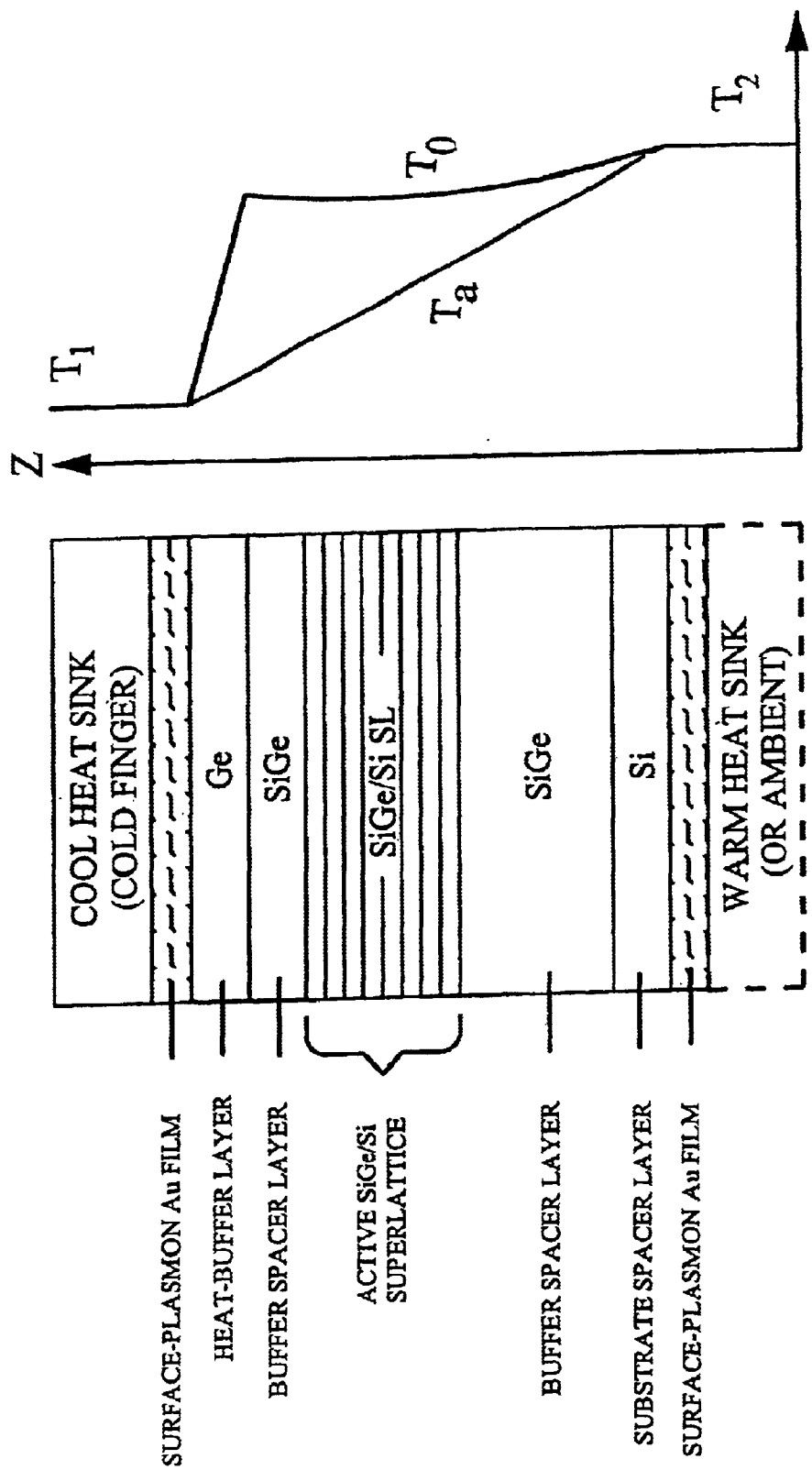
FIG. 1 is a cross-section end view of proposed phonon-pumped laser. The acoustic- and optical-phonon temperature gradient across the structure is shown.
Figure 2:
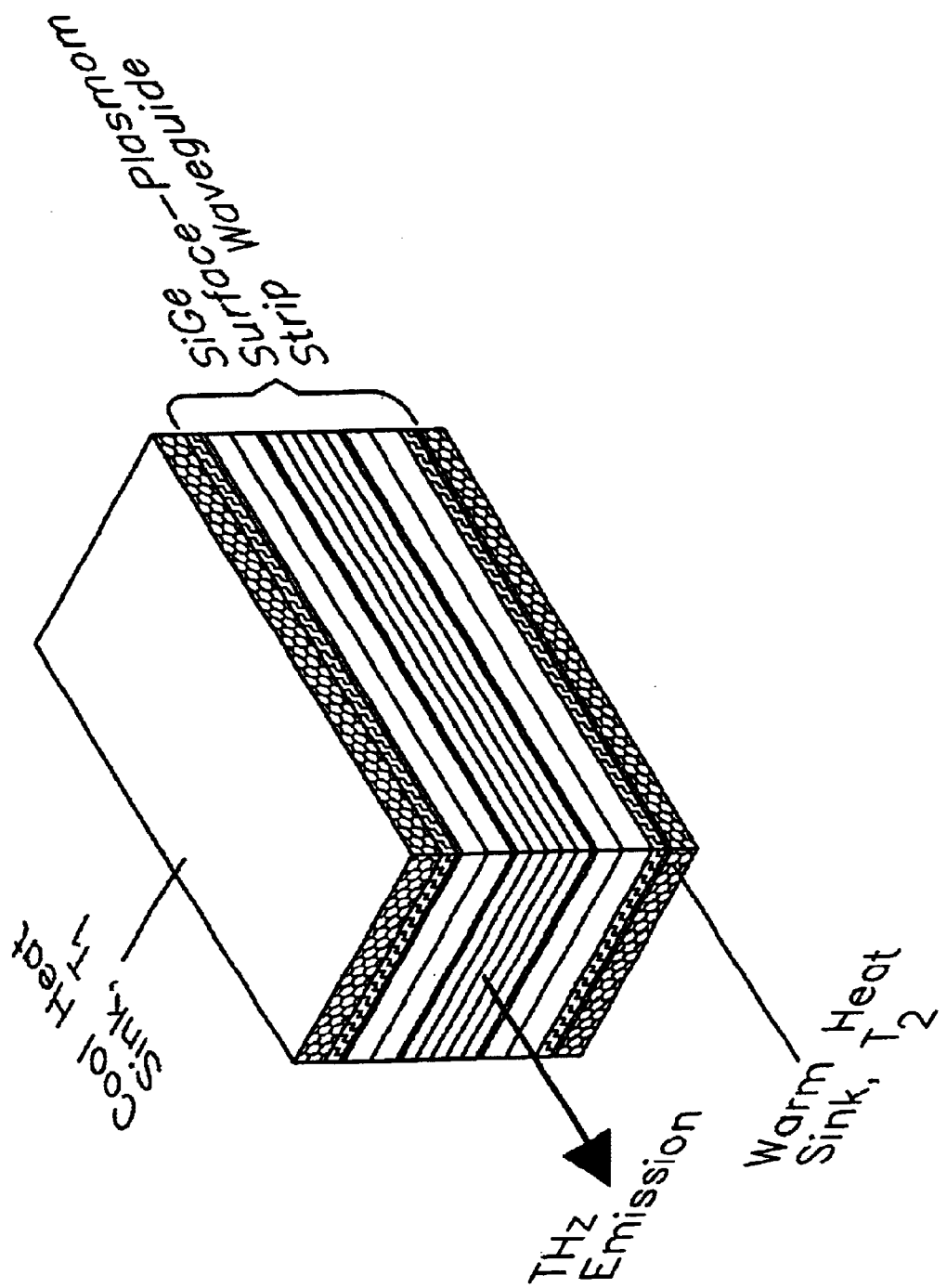
FIG. 2 is a perspective view of the FIG. 1 laser.

The laser resonator is a waveguided edge-emission Fabry-Perot cavity with cleaved end facets, and the semiconductor waveguide would be either a rib or a strip guide with surface-plasmon coatings discussed below. Our proposed design is shown in FIGS. 1 and 2. The active region in FIG. 1 consists of a p-type boron-doped (100) $Si_{1-x}Ge_x/Si$ SL active region sandwiched between two, thick, undoped $Si_{1-y}Ge_y$ layers that act as upper and lower waveguide claddings for the higher-index SL, and as SL buffer layers whose lattice constant is about midway between the QW and barrier lattice parameters in order to obtain a strain-symmetrized SL. A silicon substrate layer is present, if desired, and a Ge heat buffer layer (HBL) is deposited atop the upper $Si_{1-y}Ge_y$ buffer as discussed below. The metal coating deposited on the top and bottom of the semiconductor stack completes the far-infrared strip waveguide, and each heat sink is in contact with that plasmon film. FIG. 2 presents a perspective view of the laser and its edge emission. Phonon pumping in FIG. 1 is achieved by keeping one heat sink at the cool temperature $T_1$ while the other sink is maintained at $T_2>T_1$. In FIG. 1, the "warm" $T_2$ silicon layer generates optical and acoustic phonons that are transmitted to the active SL layers. A requirement in FIG. 1 is that the energy spectra of the optical phonons in the substrate, in the Si-rich buffers, and in the active regions overlap each other-and that the spectra are dramatically different from the HBL spectra; or ideally, we need to have a gap in the optical phonon spectrum of the HBL material at the optical-phonon frequencies of the active SL. When these requirements are met, optical phonons generated in the Si substrate will be able to travel freely into the active region, but because of the phonon frequency gap in the HBL as well as their small group velocity, optical phonons will be reflected at that interface and remain inside the active region. At the same time, acoustic phonons traversing the waveguide are free to penetrate through the HBL into the cold heat sink. Consequently, one can establish in the active region a substantial distance range. (up to the heat diffusion length, i.e., a few μm) over which the optical phonons ($T_o$) are "warmer" than the acoustic phonons ($T_a$). A schematic of these two different effective temperatures ($T_o>T_a$ is shown in the FIG. 1 temperature-gradient plots. Conveniently, a pure Ge layer can be used in FIG. 1 for the HBL since Ge has a very different optical phonon spectrum from that of Si and is known to provide confinement of Si optical phonons. The Ge layer, with a 4% lattice mismatch to Si, can be bonded to the $Si_{1-y}Ge_y$ upper cladding on top of the SL.

Several superlattice structures were evaluated using the 8-band k·p modeling software of Quantum Semiconductor Algorithms. Inc. We selected an optimum active region for the structure as a p-doped strain-balanced $Si_{0.94}Ge_{0.06}$/Si SL with 68° A wells and 35° A barriers, yielding $\hbar\omega_L$<hw, along with the 4-level-like dispersion discussed below. This is a flat band SL, and the relaxed $Si_{0.97}Ge_{0.03}$ claddings serve as freestanding SL buffers. For the three lowest-energy valence states HH1, LH1, HH2, we have calculated the miniband dispersion as a function of superlattice wavevector $k_z$ with the result given in FIG. 3. The LH1 level that intervenes between HH2 and HH1 does not influence laser operation because the low-energy TE-polarized HH2-LH1 radiative transition is suppressed by the FIG. 1 waveguide resonator. We see that the energy minimum of the HH1 miniband lies at the Brillouin zone center, and that the minimum of the excited HH2 miniband occurs at the SL Brillouin zone boundary. The energy relaxation inside each miniband occurs primarily via interaction with acoustic phonons (with some participation of the hole-hole scattering at higher densities). The inter-miniband HH2-HH1 relaxation, on the other hand, is due mainly to the interaction with optical phonons because the energy separation between the two minibands is comparable to the energy of the Si optical phonon. If the phonons are non-polar, as is the case in SiGe, the intra-miniband scattering is expected to be faster than the inter-miniband process. As long as this is true, the distribution of carriers within each miniband can be characterized by the effective temperature of the acoustic phonons, $T_a$, while the distribution between different minibands is characterized by the effective temperature of the optical phonons, $T_o$. Disregarding the variations in the density of states, we have the total population of heavy holes (provided by doping) distributed between the two minibands as $$N_{HH}=N_{HH1}(E_{f1},T_a)+N_{HH2}(E_{f2},T_a) \tag{1}$$

where the population for HH2 ($N_{HH2}$) is related to that of HH1 ($N_{HH1}$) by $$N_{HH2}=N_{HH1}\exp(-E_{12}/k_B T_o), \tag{2}$$

and $E_{12}$ is the energy separation between the two minibands. The population distribution within each miniband is further characterized by quasi-Fermi levels $E_{f1}$ and $E_{f2}$ shown in FIG. 3, and by the acoustic phonon temperature $T_a$, assuming quasi-equilibrium is established within each of the minibands due to the fast intra-miniband acoustic phonon process, $$N_{NHi}(E_{fi},Ta) = \frac{P}{\pi}\int_0^{\pi/P} dk_z \int_{E_{k_z}}^\infty D(E)f(E,E_{fi},T_a)dE, \tag{3}$$

where i=1, 2 for HH1 and HH2, respectively, $E_{k_z}$ is the miniband energy dispersion as a function of SL wavevector $k_z$, D(E) is the density of states under the approximation of parabolic in-plane dispersion with heavy-hole effective mass $m^*_{HH}$, $$D(E) = \frac{m^*_{HH}}{\pi\hbar^2 P}, \tag{4}$$

and the heavy-hole Fermi-Dirac distribution is $$f(E,E_{fi},T_a) = \frac{1}{1+\exp(E_{fi}-E)/k_B T_a}, \tag{5}$$

where P is the SL period.

Figure 3:
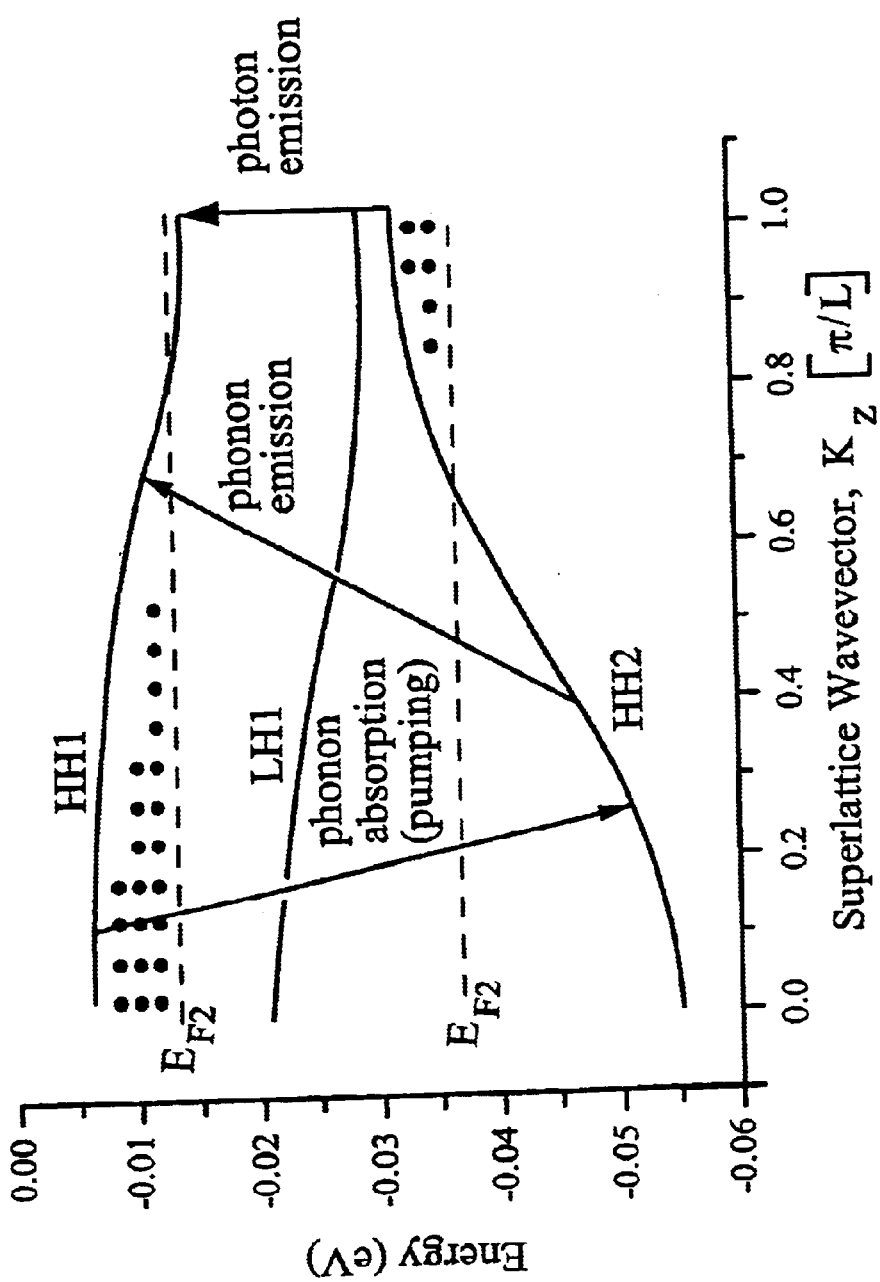
FIG. 3 is a calculated $k_2$-dispersion of a strain-symmetrized $Si_{0.94}Ge_{0.06}/Si$ superlattice illustrating phonon-pumping, relaxation, quasi-Fermi levels, hole populations, and 4- level THz lasing.
Figure 4:
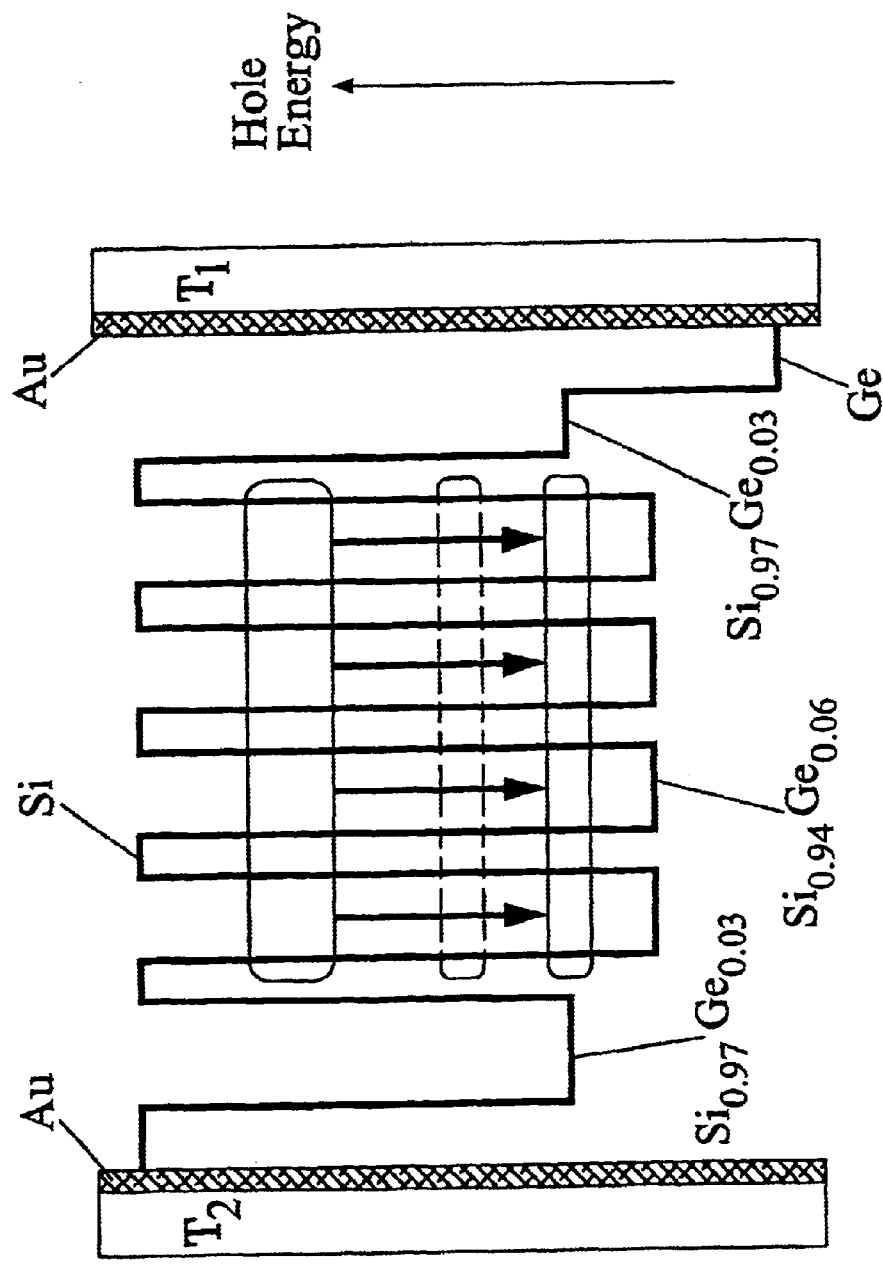
FIG. 4 is a valence band diagram of FIG. 1 structure illustrating interminiband photon emission.

It can be seen from FIG. 3 that due to the opposite energy-dispersion curvature of the two minibands, it is possible to achieve local-in-$k_z$ population inversion near the Brillouin zone boundary ($k_z=\pi/P$), even though the total population of HH2 is always less than that of HH1. It is interesting to note that the operating principle of this phonon-pumped laser is quite similar to that of a conventional band-to-band laser. Holes that are pumped by optical phonons into the HH2 mini band quickly relax toward (via acoustic phonon interaction) and populate the energy minimum within HH2 (the upper laser state) near the SL Brillouin zone boundary. Those zone-edge holes undergo a vertical lasing transition to the maximum of HH1 (the lower laser state), and they finally relax toward the bottom of the HH1 miniband at the center of SL Brillouin zone—again via a fast acoustic-phonon process. FIG. 4 illustrates the band-edge diagram of the FIG. 1 structure as a function of z and the flat-band condition is seen, along with the zone-edge THz vertical emission within each QW (the wells are pumped and emit in parallel; there is no cascade).

The condition for maintaining the difference between the effective temperatures of optical and acoustic phonons can be obtained from these simple equations with their boundary conditions:

$$K_a \frac{d^2 T_a}{dz^2} = \frac{T_a-T_o}{\tau_{a-o}}; \quad \text{with} \quad T_a(0)=T_2, T_a(L)=T_1; \tag{6}$$

and $$K_o \frac{d^2 T_o}{dz^2} = \frac{T_a-T_o}{\tau_{a-o}}; \quad \text{with} \quad T_o(0)=T_2, \frac{dT_o(L)}{dz}=0; \tag{7}$$

where z=0,L correspond to the top and bottom boundaries of the temperature gradient region, $K_a$ and $K_0$ are the heat diffusion constants of the acoustic and optical phonons respectively, and $\tau_{a-o}$ is the average time for the optical phonon-acoustic phonon scattering process. Due to the symmetry and momentum conservation considerations, the only allowed process of this type is the Umklapp type process: o→a+a−G where G is the reciprocal lattice vector and its probability is extremely low [1]. For the large difference in the diffusion constants and long $\tau_{a-o}$, one can obtain the following approximation:

$$T_o - T_a \approx (T_2 - T_1)\frac{L_{a-o}}{L}\left[\exp\left(\frac{z-L}{L_{a-o}}\right) - \exp\left(-\frac{L}{L_{a-o}}\right)\right] \quad (8)$$

where $L_{a-o}=\sqrt{K_0 l_{a-o}}$ is the characteristic length of optical-acoustic relaxation process. It indicates that the desired temperature difference can be achieved as lon as the width (L) of active region is not much longer than the characteristic relaxation length, $L_{a-o}$. With the diffusion coefficients on the order of cm²/s, if the scattering time, $\tau_{a-o}$, is on the order of few ns, this condition is achievable in the steady state in the layers of a few μm thickness, otherwise one needs to consider either pulsed operation, or injection of externally-generated hot optical phonons [2]. Such phonons can be generated either electrically or optically by the absorption of externally supplied laser radiation.

Figure 5:
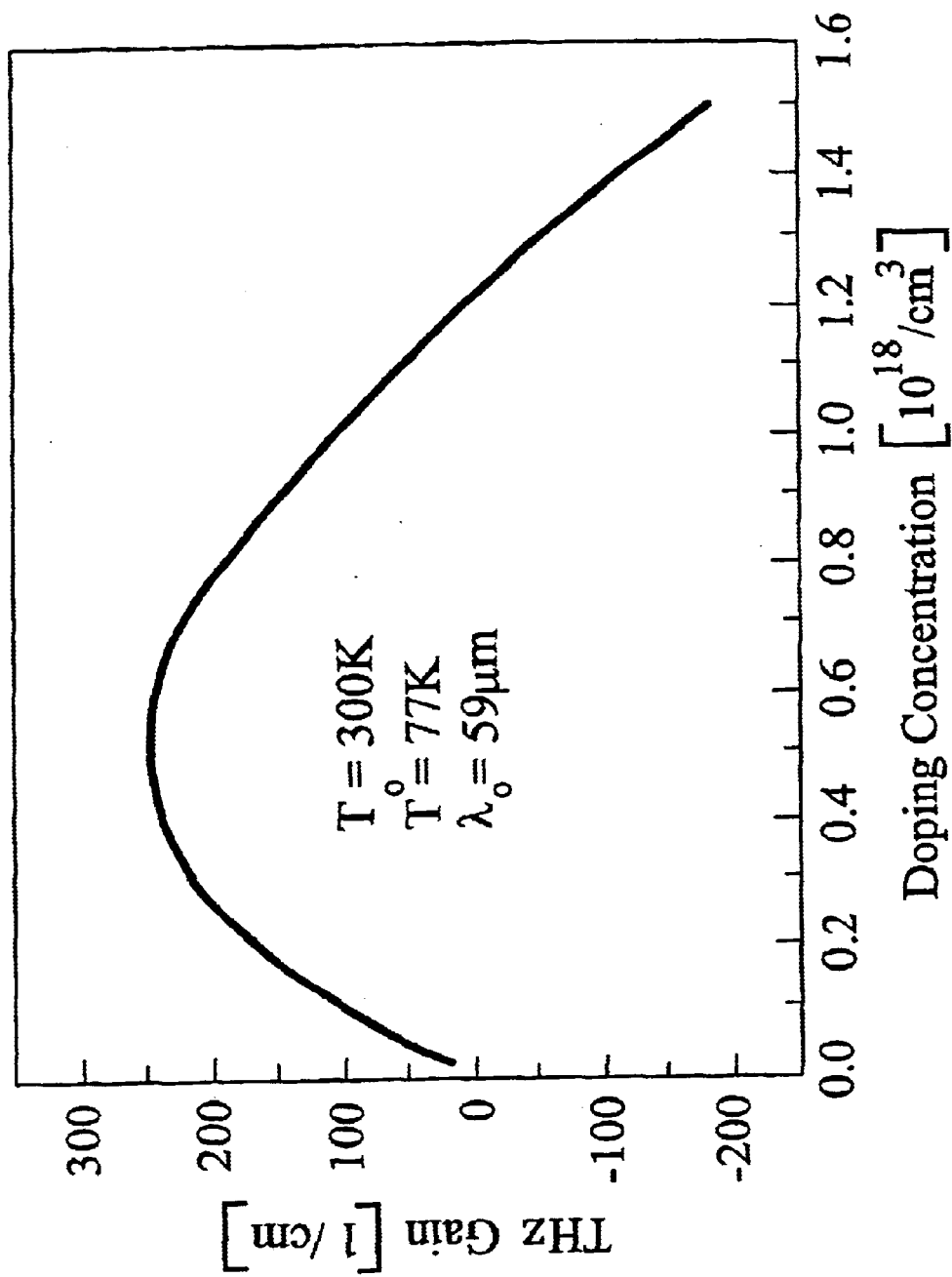
FIG. 5 is a THz gain as a function of doping concentration for $T_o$=300K and $T_a$=77K.
Figure 6:
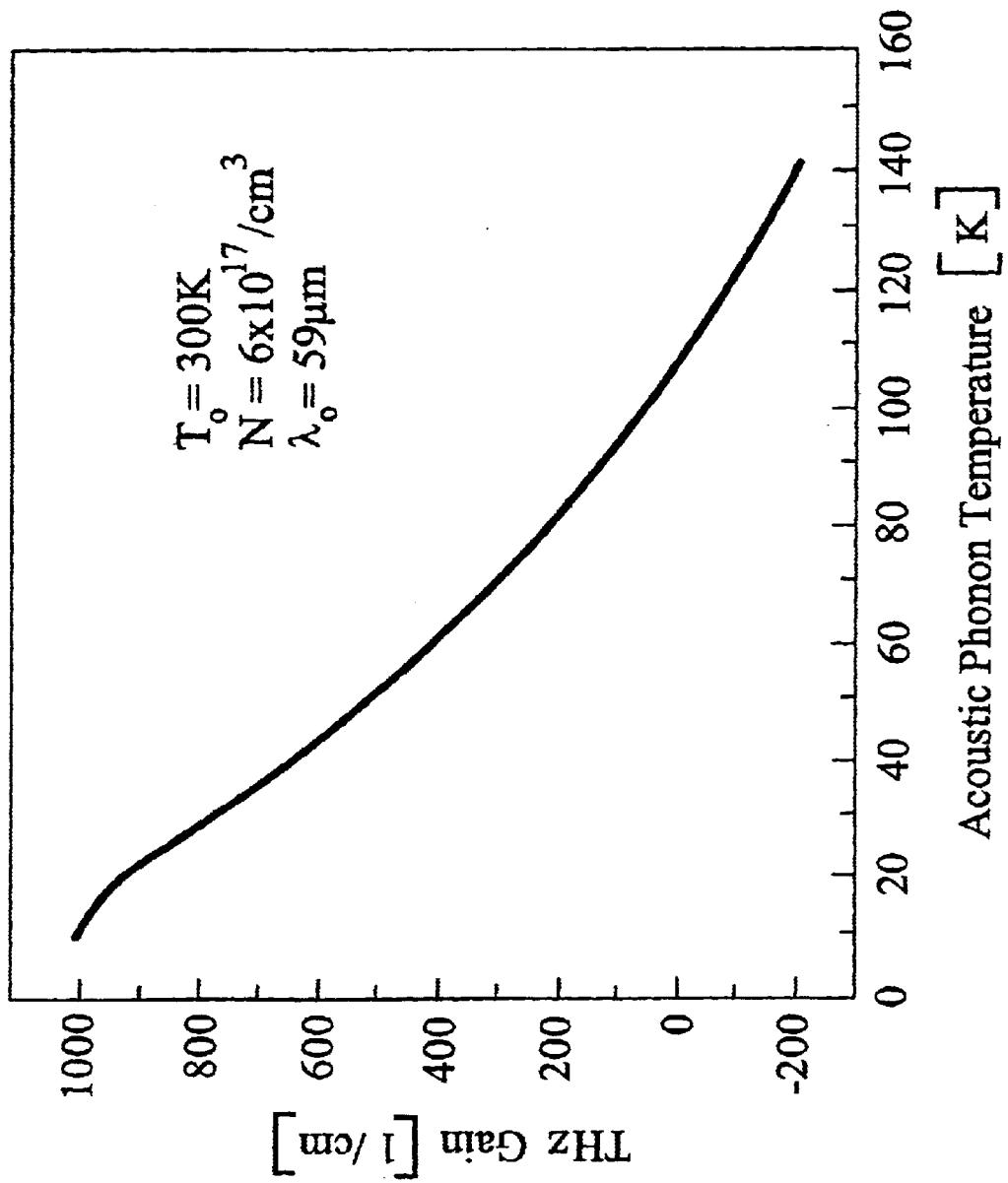
FIG. 6 is a THz gain as a function of acoustic-phonon temperature while maintaining $T_o$=300K, with $N=6\times10^{17}/cm^3$.

The FIG. 3 energy of the lasing transition at the end of the SL Brillouin zone is 21 meV, corresponding to a wavelength of 59 μm. The optical gain at this wavelength can be calculated as [3]

$$\gamma = \frac{2e^2|<l|z|u>|^2}{n\epsilon_o(\hbar\Gamma)}\frac{2\pi}{\lambda_o}(N_u - N_l) \quad (9)$$

where <u|z|l> is the dipole matrix element between the upper and lower lasing states, e is the electron charge, $\epsilon_0$ is the permittivity in free space, n is the refractive index of $Si_{0.94}Ge_{0.06}$ for the lasing wavelength $\lambda_o$, $\hbar\Gamma$ is the FWHM linewidth of the lasing line, and $N_u-N_l$ is the population difference between the upper and lower laser states. Our calculations indicate that the matrix element is approximately 13° A and we estimate $\hbar\Gamma$ is 5 meV Then, we can predict the THz gain as a function of the doping concentration (the total population density). The result is shown in FIG. 5 for the temperatures of optical and acoustic phonons maintained at 300K and 77K, respectively. It can be seen from FIG. 5 that the THz gain remains positive for a wide range of doping concentration from $1\times10^{17}/cm^3$ to $1.2\times10^{18}/cm^3$. The peak THz gain of γ=280/cm is obtained at the doping concentration of $N=6\times10^{17}/cm^3$. FIG. 6 shows the THz gain as a function of the temperature of acoustic phonons with the optimized doping density of $6\times10^{17}/cm^3$, while maintaining the temperature of optical phonons at 300K. As the temperature of acoustic phonons increases from 10K to 140K, the THz gain monotonically decreases from 1000/cm to −100/cm, with zero THz gain occurring at $T_a$=115K.

The negative dielectric constant of the FIG. 1 metal films interfaces with the positive dielectric constants of the Si and the Ge. These metal/semiconductor interfaces, with their associated surface plasmons, offer low-loss confinement of radiation at terahertz frequencies such as 3 to 10 THz because the penetration depth of the THz mode into the metal is small [4]. The width of the waveguide resonator could be anywhere from 0.5λ to 10λ. However, the waveguide height will be limited by the available run-times of epitaxy machines. In practice, the maximum thickness of the active region and its SiGe buffers will be just a few μm, compared to the 59 μm wavelength. Yet, although the height in FIG. 1 of the SL and its substrate and claddings is anticipated to be approximately 0.1λ, this metal-clad waveguide will support a single THz $TM_0$-like mode whose polarization is along the SL growth axis z [4], an E-field polarization that, beneficially, is strongly allowed by the HH2-HH1 selection rule. If the metal claddings are eliminated in FIG. 1, a conventional dielectric waveguide exists. In that all-dielectric case, the $TM_0$-like mode might be cut off if the overall height were 0.1λ; hence, the metal claddings may be essential. The mode confinement factor G which measures the overlap of the active region with the transverse guided-mode profile, is governed by the SL thickness compared to waveguide height and a value of G~0.4 is expected. Since the intensity of the THz mode tails off sharply in the metal claddings, metal loading loss is quite small, so the total loss within the waveguide cavity a, is due to primarily free carrier absorption at laser frequencies below the hole-plasma resonance frequency, i.e., $\alpha_\omega$~$\alpha_{fc}$. To reach lasing threshold, the gain γ must exceed $\alpha_\omega$. Both γ and $\alpha_\omega$ have an N dependence, hence there is a trade-off between doping concentration N and $\alpha_\omega$.

When choosing other semiconductor materials for FIG. 1, their transparency in the THz range must first be established. Several III-Vs meet the transparency criterion. For direct gap III-V SLs, the first two conduction minibands CB1 and CB2 could be utilized in an n-doped phonon-pumped superlattice, as well as using HH2 and HH1 in a p-doped SL. Let us consider what the emission wavelength λ would be in some lattice-matched phonon-pumped SLs. For an GaAs/AlGaAs SL, we estimate that λ~105 μm since $\hbar\omega_o$=36.2 meV for GaAs. For an SiC/AlN SL, we anticipate that λ~32 μm since $\hbar\omega_o$=119.3 meV for SiC. Thus, the 3 to 10 THz emission range could be spanned by appropriate choice of materials, doping, and SL layer thicknesses.

We have presented the first phonon-pumped semiconductor laser, a far-infrared interminiband device. It consists of a p-type $Si_{0.94}Ge_{0.06}/Si$ SL with $Si_{0.97}Ge_{0.03}$ cladding layers grown on Si. The pumped, flat-band SL is contained in a plasmon-clad $TM_o$-like strip waveguide. A "warm" heat-sink and a "cool" heat sink sandwich the waveguide. They create a useful temperature gradient for hole pumping. The Ge "heat-buffer layer" separating the active region from the cold heat sink reflects the optical phonons and maintains a "warmer" effective temperature of optical phonons in the active region. The difference in effective temperatures of optical and acoustic phonons provides pumping for the lasing transition between the minibands of HH2 and HH1. Our result has shown that THz gain on the order of a few hundred cm$^{-1}$ can be achieved readily over a range of doping concentrations and effective temperatures of acoustic phonons. In particular, gain of 280/cm, at 5 THz is predicted for $6\times10^{17}/cm^3$ doping at effective temperatures of optical and acoustic phonons of 300K and 77K respectively.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A phonon-pumped semiconductor interminiband laser produces lasing emissions and uses a temperature gradient and optical phonons to excite carriers from a ground-state miniband of a superlattice to an excited miniband, and which does not utilize optical pumping or electrical pumping, and comprises:

a means for generating phonons;

an active superlattice which receives the phonons from the generating means to produce a first set of carriers responsive to phonons at a first optical phonon spectra and being pumped from a populated ground state to a first upper miniband CB1, wherein said active superlattice comprises an active Si Ge/Si superlattice containing the carriers at the populated ground state and which has a quantum well and barrier composition and thickness which produces two minibands of excitation along with Z axis in response to the first and second sets of carriers when stimulated to produce the lasing emissions;

a heat buffer layer having a Brillouin zone boundary with and place on top the active superlattice and which receives the phonons from the generating means to produce a second set of carriers responsive to phonons at a second optical phonon spectra and reflecting phonons from the first optical phonon spectra back down through the active superlattice to stimulate the lasing emissions in the active superlattice thereby at the Brillouin zone boundary between the active superlattice and the heat buffer layer, said heat buffer layer having properties with respect to optical and acoustic phonons that are thermally adjustable; and a set of warm and cool hear sinks, that create a temperature gradient across the active superlattice wherein the buffer layer is adjacent to the cool sink so that it reflects optical phonons and transmits acoustic phonons.

* * * * *